(12) United States Patent
Rufer et al.

(10) Patent No.: US 11,387,403 B2
(45) Date of Patent: Jul. 12, 2022

(54) PIEZOELECTRIC ENERGY HARVESTING BENDING STRUCTURE AND THE METHOD OF MANUFACTURING THEREOF

(71) Applicants: UNIVERSITÉ GRENOBLE ALPES, Saint Martin d'Hères (FR); VERMON S.A., Tours (FR)

(72) Inventors: Libor Rufer, Rives sur Fure (FR); Skandar Basrour, Grenoble (FR); Emilie Trioux, Grenoble (FR); Guillaume Férin, Truyes (FR); Claire Bantignies, Tours (FR); Hung Le Khanh, Malakoff (FR); Bogdan Rosinski, Langeais (FR); An Nguyen-Dinh, La Riche (FR)

(73) Assignees: VERMON S.A., Tours (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 446 days.

(21) Appl. No.: 16/628,299

(22) PCT Filed: Jul. 5, 2018

(86) PCT No.: PCT/IB2018/000716
§ 371 (c)(1),
(2) Date: Jan. 3, 2020

(87) PCT Pub. No.: WO2019/008431
PCT Pub. Date: Jan. 10, 2019

(65) Prior Publication Data
US 2020/0220067 A1    Jul. 9, 2020

Related U.S. Application Data

(60) Provisional application No. 62/528,886, filed on Jul. 5, 2017, provisional application No. 62/532,195, filed on Jul. 13, 2017.

(51) Int. Cl.
*H01L 41/09* (2006.01)
*H01L 41/113* (2006.01)
(Continued)

(52) U.S. Cl.
CPC ...... *H01L 41/1136* (2013.01); *H01L 41/0838* (2013.01); *H01L 41/27* (2013.01); *H02N 2/186* (2013.01)

(58) Field of Classification Search
CPC .. H01L 41/083; H01L 41/0926; H01L 41/094
See application file for complete search history.

(56) References Cited

U.S. PATENT DOCUMENTS

| 5,408,376 A | 4/1995 | Nishikura et al. |
| 2007/0053531 A1* | 3/2007 | Ohta ............... H04R 17/00 381/152 |

(Continued)

FOREIGN PATENT DOCUMENTS

| JP | H06-203351 A | 7/1994 |
| JP | 2009-288617 A | 12/2009 |

OTHER PUBLICATIONS

European Patent Office, Examination Report issued in corresponding Application No. 18 749 492.7, dated Oct. 22, 2020.
(Continued)

*Primary Examiner* — Jae Lee
(74) *Attorney, Agent, or Firm* — Stites & Harbison, PLLC; Jeffrey A. Haeberlin; James R. Hayne

(57) ABSTRACT

A piezoelectric bimorph cantilever beam system includes a shim having a first main surface, a second main surface opposite the first main surface, a proximal end connected to an anchor, and a distal end opposite the proximal end. The system further includes a first piezoelectric layer laminated on the first main surface of the shim and a second piezoelectric layer laminated on the second main surface of the shim. A first beam stiffener is provided over the first main surface of the shim adjacent to the anchor with the first beam stiffener at least partially covering the first piezoelectric layer. A second beam stiffener is provided over the second main surface of the shim adjacent to the anchor with the second beam stiffener at least partially covering the second piezoelectric layer.

14 Claims, 8 Drawing Sheets

(51) Int. Cl.
*H01L 41/083* (2006.01)
*H01L 41/27* (2013.01)
*H02N 2/18* (2006.01)

(56) References Cited

U.S. PATENT DOCUMENTS

| | | | | |
|---|---|---|---|---|
| 2007/0138909 A1* | 6/2007 | Mortet | ................. | G01N 29/245 |
| | | | | 310/318 |
| 2007/0252479 A1* | 11/2007 | Ishikawa | .............. | H03K 17/964 |
| | | | | 310/339 |
| 2008/0302024 A1* | 12/2008 | Browne | .................... | E04B 1/00 |
| | | | | 52/1 |
| 2009/0315335 A1* | 12/2009 | Ujihara | ............... | H01L 41/1136 |
| | | | | 310/306 |
| 2013/0207520 A1* | 8/2013 | Near | ................... | H01L 41/1134 |
| | | | | 310/339 |
| 2014/0175948 A1* | 6/2014 | Tanaka | ................. | H01L 41/053 |
| | | | | 310/330 |
| 2017/0229630 A1* | 8/2017 | Zhan | ........................ | H02N 1/08 |

OTHER PUBLICATIONS

European Patent Office, International Search Report and Written Opinion issued in corresponding Application No. PCT/IB2018/000716 dated Nov. 2, 2018.

\* cited by examiner

PIEZOELECTRIC ENERGY HARVESTING BENDING STRUCTURE AND THE METHOD OF MANUFACTURING THEREOF

RELATED APPLICATIONS

This application claims the benefit of U.S. Provisional Application No. 62/528,886, filed Jul. 5, 2017, and U.S. Provisional Application No. 62/532,195, filed Jul. 13, 2017 the entire disclosures of which are incorporated herein by this reference.

TECHNICAL FIELD

The invention is related to piezoelectric cantilever structures for the production of electrical energy using ambient mechanical vibrations or movements. The piezoelectric cantilever may be used associated with an electronic power management circuit for the optimization of energy harvesting action to powering electric systems such as sensors, electronic circuits or systems.

BACKGROUND OF THE INVENTION

Producing electrical energy without battery and life duration constraint for the energy supply source is one of the challenges of electronic devices to comply with current environmental concerns. Thus, energy-harvesting systems are one of the most relevant solutions for battery replacement. Harvesting the ambient vibrational energy using piezoelectric cantilever bimorph beams/structures has long been investigated and prototyped. FIG. 1 represents the prior art and is the lateral view of a typical bimorph cantilever beam 1 being rigidly clamped within an anchor, or anchoring module 2. The portion of the cantilever beam 1 contained within the anchoring module 2 can be defined as a "clamped area" of the cantilever beam 1 and the portion of the cantilever beam 1 outside of the anchoring module 2 can be defined as a free length, or "bending area." Usually the cantilever beam 1 is terminated on its free extremity by a seismic mass 3 that is chosen to provide a desired resonant frequency to the system. The resonant frequency of such a system is mainly governed by the stiffness of the cantilever beam 1 and the seismic mass 3 being attached to the extremity of the cantilever beam 1. The stiffness of the cantilever beam 1 depends on the elastic constants of the material used and on the length and the thickness of the cantilever beam 1 in the bending area.

Oftentimes, these structures exhibit a multi-layered structure to maximize the efficiency of device. The most common design for a cantilever bimorph beam generally comprises, an amorphous shim layer (core) being sandwiched between two electrode-plated piezoelectric layers and optionally a seismic mass is attached at the extremity of the beam. The cantilever beam is maintained rigidly on one extremity opposite to those where seismic mass is attached. When subjected to vibrations, the cantilever beam is subject to oscillations and its extremity vibrates with a certain amplitude. During this operation, internal strains are generated into the piezoelectric layers, and the electrical charges inherently occurring can then be collected by shunting the piezoelectric layers with an electronic power management circuitry.

When strongly solicited in vibration, the principle of cantilever beams makes mechanical strains developed within its piezoelectric layers and along the cantilever beam to produce electrical charges; however strain level is not regularly distributed over the long axis of the beam and highest strains are founded at the junction interface between the cantilever beam and the anchoring module. As such, piezoelectric cantilever beams oftentimes are composed with central and external layers that are differently subject to mechanical stress when the structure is bent in the direction orthogonal to the main surface of the beam; the central line corresponding to the symmetry axis of the beam's shim in thickness section will theoretically generate no mechanical stress and is called the neutral axis or fiber of the beam, while the other layers attached on the opposite faces and distant from the neutral axis are subject to stress proportionally to the distance separating the neutral axis. Furthermore, at the area where the cantilever beam is embedded into the anchoring module no bending is permitted, and the external junction interface defined by the cantilever beam and the anchoring module is the area where intense stress may occur. This leads to exponential elevation of mechanical constraints in the cantilever beam's structure. The extremely high stresses observed at this area are sources of damage to the beam with micro-cracks or delamination of the materials impacting dramatically the reliability or the mean time before failure (MTBF) of the device.

So far, several optimizations for the piezoelectric bimorph cantilever beams have been disclosed to improve reliability and robustness. Examples of design are disclosed in publications done by Benasciutti D. et al. (Vibration energy scavenging via piezoelectric bimorphs of optimized shapes, Microsyst Technol, 2010, pp. 657-668) and by Defosseux, M. et al. (Comparison of different beam shapes for piezoelectric vibration energy harvesting, Proceedings of Power-MEMS 2010), wherein cantilevers with a variable width were studied and tested. The solutions proposed by Benasciutt and Defosseux make the beams modified in shapes and may be crippling for some applications constrained by geometry. Another disclosure by Seddik, B. A et al. US 2013/0342075 wherein variable thickness of the middle shim layer leads to a decrease of the stress at the clamped side and to its better distribution comparing to structures with a constant thickness. Unfortunately making such a shim is not common process and will require specific tooling and accurate control of the shim thickness variation.

Taking into account the above description, there is an obvious need for a better design of piezoelectric cantilever beam that will overcome the drawbacks above-mentioned.

SUMMARY OF THE INVENTION

The objective of the present invention is to provide a new design of piezoelectric bimorph cantilever beam and the related method of manufacturing in order to control the mechanical constraints and stresses occurred at the anchoring interface therefore to enhance the robustness and durability of the piezoelectric bimorph cantilever beam in operation. From a common structure of a piezoelectric bimorph cantilever beam wherein the constituting layers are uniform in thickness and symmetrically disposed with respect to the neutral axis or fiber, the piezoelectric bimorph cantilever beam of the present invention is equipped with beam stiffening portions or beam stiffeners provided over the main surfaces of piezoelectric bimorph cantilever beam and having its tensile strength varying from the anchoring interface toward the opposite extremity of said beam. The presence of the beam stiffeners will minimize the stress at the anchored interface of the beam by the action of distributing the mechanical stress progressively from the anchoring interface to the opposite extremity of beam. The stress reduction will lower the fatigue at the anchoring interface and therefore increase the lifetime of the harvester in movement.

In some embodiments, beam stiffeners are provided on each side of the beam and the tensile strength variation of the beam stiffener is obtained by varying its thickness. Moreover, if the variation of the thickness is defined as a function of a coordinate parallel with the beam length and is optimally designed, the maximal stress in the beam can be tuned in agreement with specifications. In such a case, a decrease of stress at the anchoring interface will not affect the overall power output of the system (beam+anchoring module). In order to facilitate the manufacturing and realization mode of the first embodiment of the present invention, variable thickness of beam stiffeners can be realized by using multiple layers of stiffeners made up of same material and having variable lengths. If the length of each layer is properly designed, the whole multilayer structure so obtained can approximate a beam stiffener having the variable thickness. The thickness and the number of the layers will govern the accuracy of this approximation. In the extreme simplification, only one layer can be considered.

In some other embodiments, the tensile strength variation of the stiffener is obtained by modifying the material composition of beam stiffeners using variable stiffness layers or structuring the layers with holes performed into the material, or providing inclusions of one or several materials inside the layers of beam stiffeners. Many different geometries and compositions can be applied according to the stiffness to obtain and holes can be filled with material of different tensile properties.

In still other embodiments, the layer thickness of the bimorph structure, in particular the outer layers, can vary along a coordinate parallel to the beam length.

BRIEF DESCRIPTION OF THE DRAWINGS

Embodiment herein will hereinafter be described in conjunction with the appended drawings and illustrations provided to illustrate and not limit the scope of the claims:

DETAILED DESCRIPTION OF EXEMPLARY EMBODIMENTS OF THE INVENTION

Referring now to the figures and illustrations, the present invention relates to systems and methods of manufacturing piezoelectric Bimorph Cantilever Beam (pBCB) to harvest electrical energy directly from vibrations of the surrounding environment. Although the present invention is not limited the bimorph cantilever beams, this particular embodiment will be used for the description of the present application for the sake of clarity. In this invention, the pBCB is mainly devoted and designed for low frequency vibration in the range of dozens of Hz and is preferably designed to exhibit small dimensions and volume to be integrated into sensor implants for medical applications or sensor nodes for industrial applications. However, the present invention is not limited to these particular design choices.

The principle of operation is based on mechanical stress created on the piezoelectric layers to produce electrical charges on electrodes that are then collected and rectified by a Power Management Circuit (PMC) for charging batteries or super-capacitors or powering a system or sensors. As a cantilever beam structure, pBCBs are commonly designed in beam shape wherein the thickness dimension is small as compared to other dimensions of the structure and vibration forces are applied preferably in the direction perpendicular to the thickness of the device in order to bend the structure and therefore stressing the piezoelectric material in the preferred crystallographic orientation.

Figure 1:
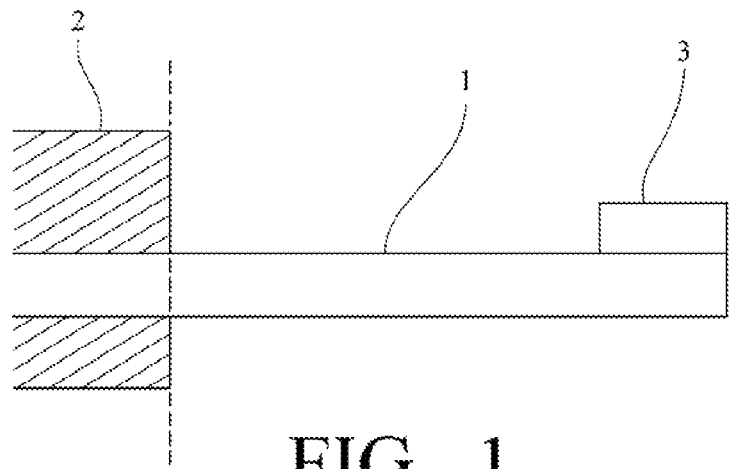
FIG. 1 is a sectional view of a typical bimorph cantilever beam as commonly known in the prior-art.
Figure 2:
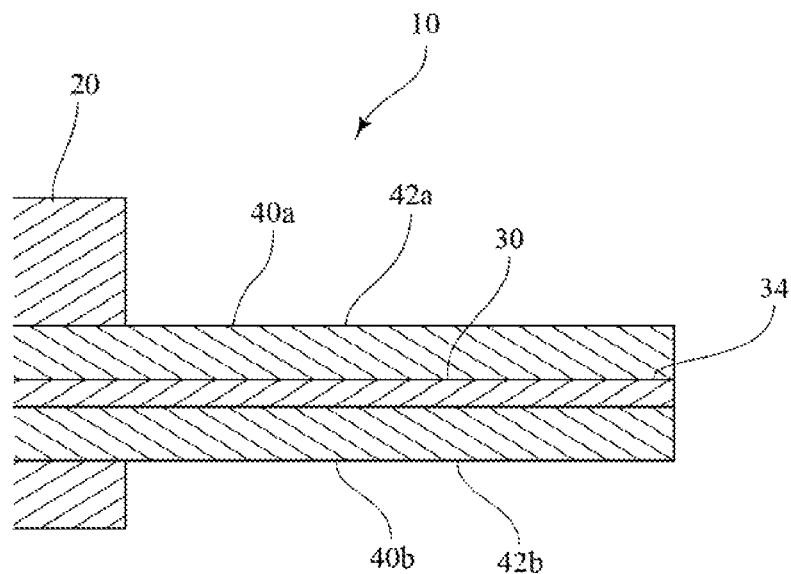
FIG. 2 is a sectional view of a piezoelectric bimorph cantilever beam having a shim sandwiched between two piezoelectric layers.
Figure 3:
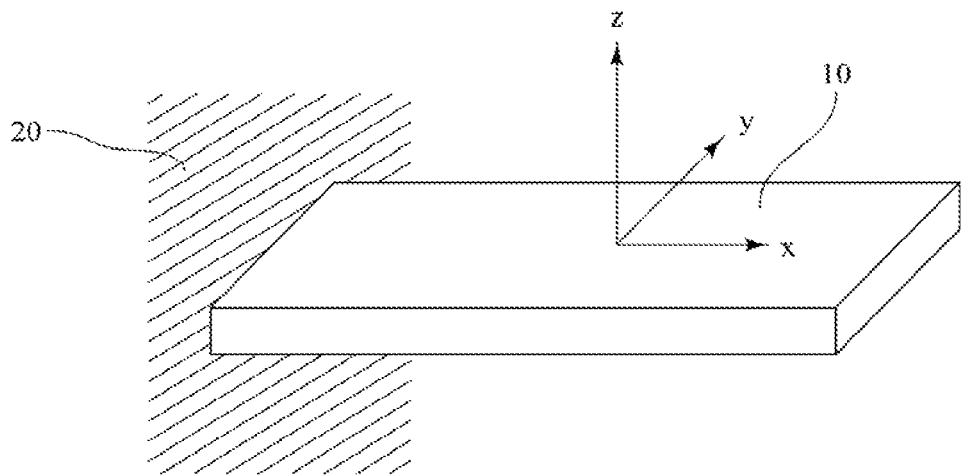
FIG. 3 is an illustration of the different directions used in a cantilever beam system.

In FIG. 2 a detailed view of a pBCB 10 is provided wherein a shim 30 is sandwiched between a first piezoelectric layer 40a and a second piezoelectric layer 40b preferably symmetrically disposed with regard to the shim 30. In particular, the shim 30 has a proximal end 32 which extends into and is connected to an anchor, or anchoring module 20, and a distal, or free, end 34 opposite the proximal end 32. The first piezoelectric layer 40a is laminated on a first main surface 36 of the shim 30 and the second piezoelectric layer is laminated on a second main surface 38 of the shim 30 opposite the first main surface 36. Each of the first and second piezoelectric layers 40a, 40b have electrodes (not shown) deposited on the surfaces 42a, 42b thereof. As usually employed, three main perpendicular directions mechanically characterize the pBCB 10 as shown in FIG. 3 wherein the vertical direction Z is perpendicular to the main surfaces of the said pBCB 10, the directions X and Y are parallel to the main surfaces of the pBCB 10. As shown in FIG. 2, it is preferable that each of the piezoelectric layers 40a, 40b have substantially similar thicknesses to provide symmetrical operation when moved up and down. According to the present invention, however, the piezoelectric layers are provided in different thicknesses or in variable thicknesses or having different surface areas, as discussed further below.

Depending on the vibration frequencies to harvest, the length and the stiffness of the pBCB 10 govern the resonant frequency of the device, while the width dimension will affect the electrical output power proportionally. The length of the pBCB 10 is typically in the range of few tens of millimeters up to one hundred (100) millimeters for a low frequency system (<100 Hz). The pBCB 10 width is defined to optimize the total surface of the pBCB 10 (electrical power) and can be fine-tuned according to the volume constraints of the system, typically the width is inferior to the length, ranging typically from few millimeters to several tens of millimeters. The shim layer constituting the neutral axis, or fiber, is determined as thin as possible in order to maximize the piezoelectric material ratio of the device while maintaining the total thickness in reasonable proportions. To facilitate the fabrication process, its thickness is typically around ten (10) micrometers. The piezoelectric layers 40a, 40b have typically both the same thicknesses to maintain the neutral fiber within the thickness of the shim 30. The thickness of the piezoelectric layers 40a, 40b is defined based on the working frequency and power considerations. For a typical frequency range (from few hertz to few hundreds of hertz), the minimum thicknesses are typically around few micrometers, and maximum thicknesses are up to few hundreds of micrometers.

Figure 4:
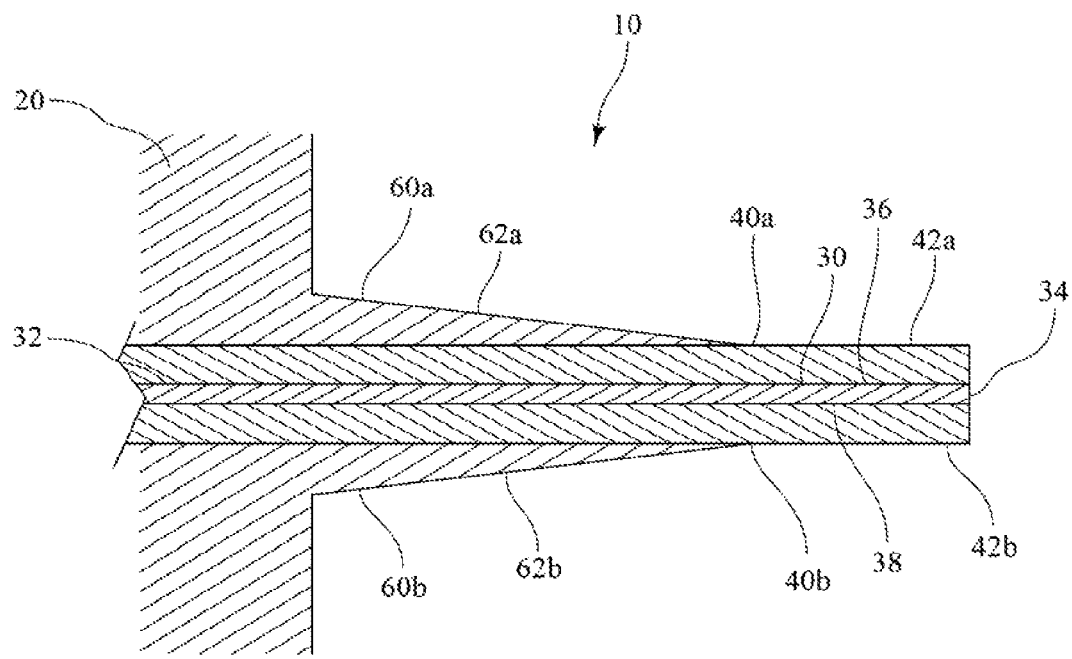
FIG. 4 is a sectional view of a first embodiment of a piezoelectric bimorph cantilever beam system made in accordance with the present invention.

Referring now to FIG. 4, in one exemplary system of the present invention, a pBCB 10 mounted into the anchoring module 20 incorporates a first beam stiffener 60a and a second beam stiffener 60b symmetrically disposed on both main surfaces of the pBCB (e.g., exterior surfaces 42a, 42b of the piezoelectric layers 40a, 40b). In particular, the exemplary pBCB 10 includes a shim 30 having a first main surface 36, a second main surface 38 opposite the first main surface 36. Furthermore, a proximal end 32 of the shim 30 is connected to an anchoring module 20 and a distal end 34 is opposite to the proximal end 32. Although not shown, the distal end of the pBCB 10 (i.e., adjacent to the distal end 34 of the shim 30) is configured to attach a seismic mass.

The exemplary pBCB 10 further includes a first piezoelectric layer 40a laminated on the first main surface 36 of the shim 30 and a second piezoelectric layer 40b laminated on the second main surface 38 of the shim 30. Each of the piezoelectric layers 40a, 40b includes one or more electrodes (not shown) positioned on the exterior surfaces 42a, 42b thereof. The electrodes are typically uniform in the width, i.e., the Y direction in FIG. 3, and extend substantially the entire length of the pBCB 10. In some preferred embodiments, however, the electrodes do not extend entirely to the distal end 34 of the shim 30 as the bending strain at the free-end of the pBCB 10 is too low to efficiently contribute to electrical charge collection. In particular, when a seismic mass is connected to the pBCB 10, no bending is permitted at the interface between the seismic mass and the pBCB 10, and therefore there is no need for the electrodes to be present at this interface. The thicknesses of the electrodes range from few hundreds of nanometers to few micrometers, depending on the deposition process used to obtain them. The electrodes also typically extend through the anchoring module 20 in order to connect the pBCP 10 to the rest of a system, such as sensors or electronic circuits. In order to minimize the parasitic capacitance of the electrodes under the anchoring module 20, however, only a small part of the pBCB 10 width is covered with the electrodes, typically a quarter of the pBCB 10 width.

Additionally, the two piezoelectric layers 40a, 40b are electrically connected in a serial configuration. To that end, the shim 30 must be electrically conductive in order to electrically connect the both piezoelectric layers 40a and 40b. Therefore the shim 30 material is preferably metallic such as copper or aluminum whereas the piezoelectric layers 40a, 40b are typically PZT or other lead-free materials (e.g. PNM-PT, BTN).

As previously mentioned, the pBCB 10 includes a first beam stiffener 60a provided over the exterior surface 42a of the first piezoelectric layer 40a, and a second beam stiffener 60b provided over the exterior surface 40b of the second piezoelectric layer 40b. As shown in FIG. 4, each of the beam stiffeners 60a, 60b have variable thickness. In particular, the beam stiffeners 60a, 60b have a respectively thicker section immediately adjacent to the anchoring module 20 with the thickness decreasing from the anchoring module 20 towards the distal end 34 of the shim 30 before terminating at a predetermined distance along pBCB 10. In the embodiment shown in FIG. 4, the thickness variation of the beam stiffeners 60a, 60b is defined as a linear function between the length and the thickness. That is to say, the exterior surfaces 62a, 62b of the beam stiffeners 60a, 60b are substantially flat, or linear. In some embodiments, the particular shape of beam stiffeners is obtained based on a modeling process taking into account the longitudinal component of the stress in the structure. In particular, the longitudinal stress component in an optimally compensated structure with stiffeners is constant along the whole free length of the pBCB. To reach this, the shape of the stiffener should correspond to the shape of the stress profile in the free length of the pBCB.

In some exemplary embodiments, the beam stiffeners are preferably symmetrical and the beam stiffeners preferably have a width i.e., the Y direction in FIG. 3, substantially the same as the width of the shim. The length of the beam stiffeners is not particularly limited, and can be modified depending on the desired response of the pBCB of the present invention. That is to say, in some embodiments, beam stiffeners extend substantially the entire length of the pBCB while, in some other embodiments, beam stiffeners terminate part-way along the length of the pBCB.

In the exemplary system shown in FIG. 4, the beam stiffeners 60a, 60b are integrated into (e.g., formed simultaneously with) the anchoring module 20. To this end, the material for beam stiffeners 60a, 60b can be made up of same as those of the anchoring module 20 and formed, for example, by overmolding a polymer or a composite resin over the pBCB 10. In other embodiments, however, the beam stiffeners are made of material having the density and the Young's modulus different than those of anchoring module 20. For example, in some embodiments the beam stiffeners are comprised of a metal (e.g., aluminum, copper, etc.) an organic material, or a composite of both (e.g., FR4, alumin, etc.) whereas the anchoring module 20 is comprised of with similar materials or heavier materials such as, for example, tungsten. In embodiments where the beam stiffeners are comprised of an electrically conductive material, it is contemplated that the beam stiffeners can act as electrodes themselves, thus eliminating the need for additional electrodes on the exterior surfaces of the piezoelectric layers.

Figure 5:
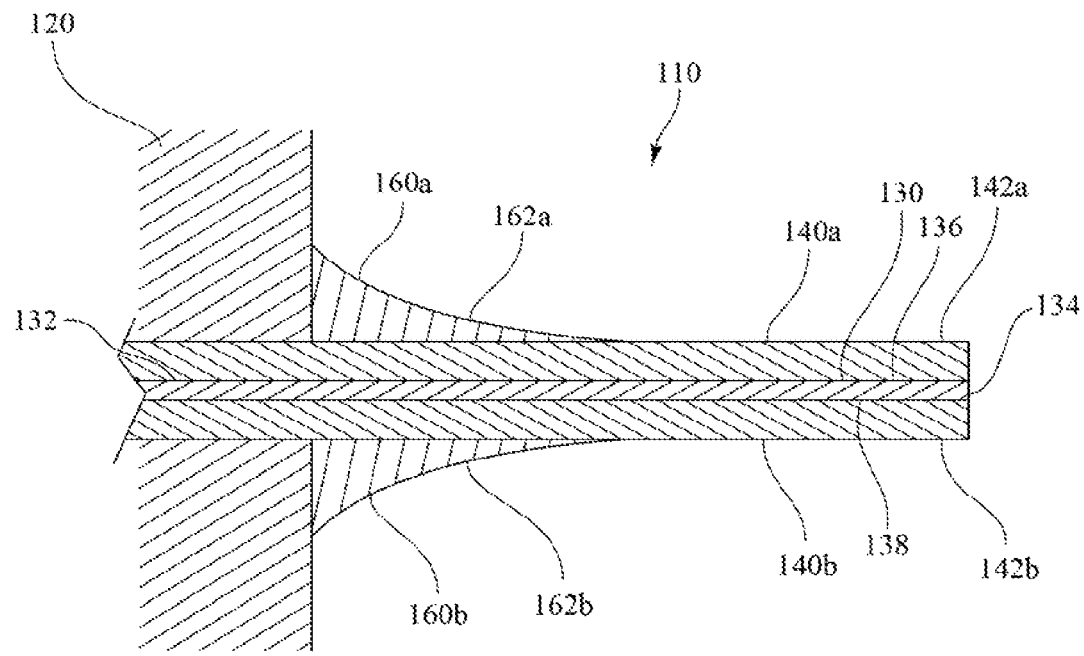
FIG. 5 is a sectional view of a second embodiment of a piezoelectric bimorph cantilever beam system made in accordance with the present invention.

As previously discussed, in the embodiment shown in FIG. 4, the thickness variation of the beam stiffeners 60a, 60b is defined as a linear function between the length and the thickness. Referring now to FIG. 5, in another exemplary system, the thickness variation of the beam stiffeners are defined as a non-linear function. In other words, the exterior surfaces of the beam stiffeners are curved. In particular, in the exemplary system shown in FIG. 5, the exemplary pBCB 110 includes a shim 130 having a first main surface 136, a second main surface 138 opposite the first main surface 136, a proximal end 132 connected to an anchoring module 120 and a distal end 134 opposite to the proximal end 132 substantially similar to the pBCB 10 described above. The exemplary pBCB 110 further includes a first piezoelectric layer 140a laminated on the first main surface 136 of the shim 130 and a second piezoelectric layer 140b laminated on the second main surface 138 of the shim 130 substantially similar to the pBCB 10 described above.

Also similar to system of FIG. 4, a first beam stiffener 160a is provided over the exterior surface 142a of the first piezoelectric layer 140a, and a second beam stiffener 160b provided over the exterior surface 140b of the second piezoelectric layer 140b, but unlike the system of FIG. 4, and as previously mentioned, in the exemplary system shown in FIG. 5, the thickness variation of the beam stiffeners 160a, 160b are defined as a non-linear function such that the exterior surfaces 162a, 162b of the stiffeners 160a, 160b are curved. Of course, the section profile of the beam stiffeners can take many forms and shapes thus giving several degrees of design freedom according to the present invention. Once again, the curvature of the exterior surface 162a of the first beam stiffener 160a can be made identical or different to the curvature of the exterior surface 162b of the second beam stiffener 160b, depending on the desired effect.

Furthermore, similar to the system shown in FIG. 4, as illustrated in FIG. 5, the pBCB 110 is embedded into an anchoring module 120. The beam stiffeners 160a, 160b, however, are independent of the anchoring module 120 as opposed to being integrated into the anchoring module 120. Of course, curved beam stiffeners, such as those shown in FIG. 5 could be integrally formed with the anchoring module substantially similar to the configuration described above with respect to FIG. 4.

Figure 6:
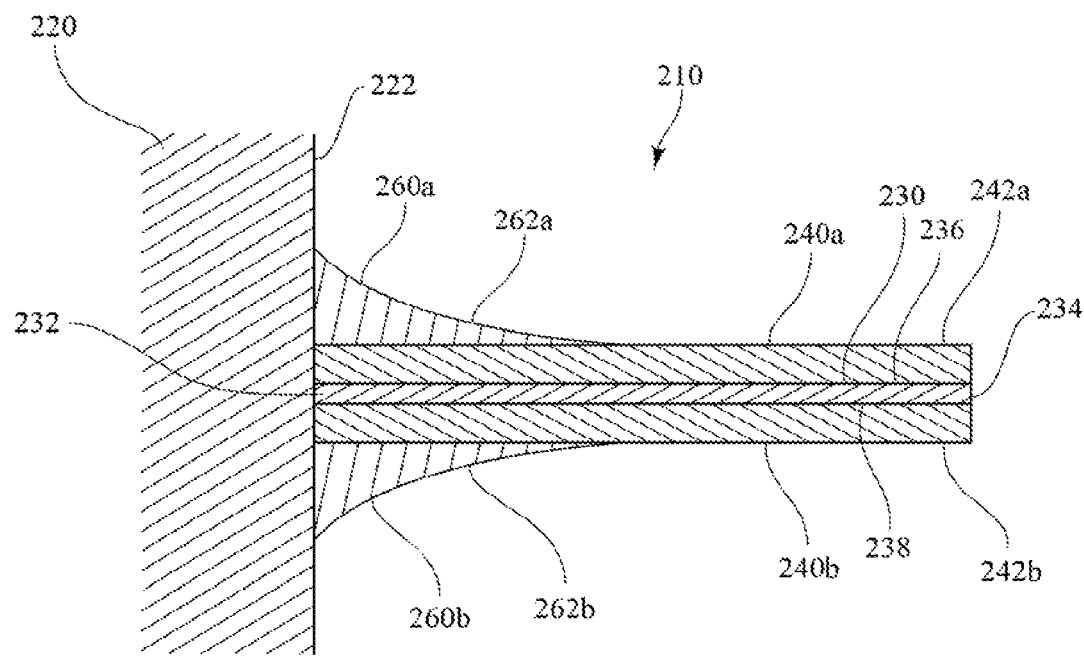
FIG. 6 is a sectional view of a third embodiment of a piezoelectric bimorph cantilever beam system made in accordance with the present invention.
Figure 7:
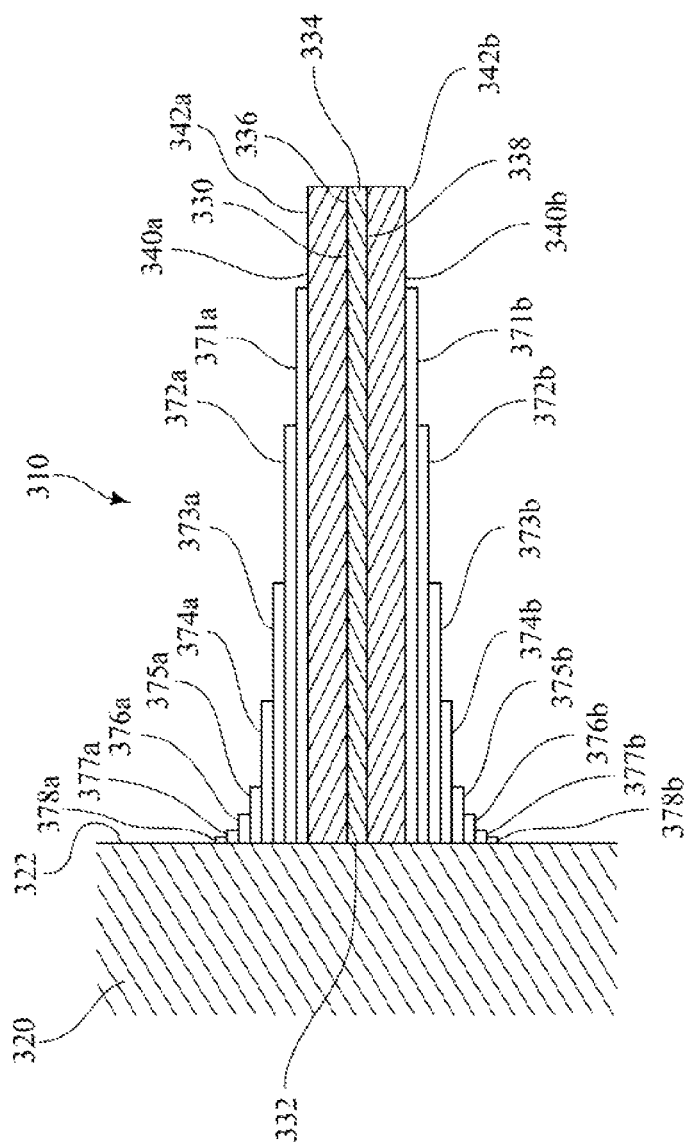
FIG. 7 is a sectional view of a fourth embodiment of a piezoelectric bimorph cantilever beam system made in accordance with the present invention.

Referring now to FIGS. 6 and 7, in some embodiments of the present invention, rather than embedding the pBCB into the anchoring module, the pBCB is attached directly to the side surface of the anchoring module. In particular, and with reference to FIG. 6 in particular, the exemplary pBCB 210 includes a shim 230 having a first main surface 236, a second main surface 238 opposite the first main surface 236, a proximal end 232 positioned immediately adjacent to a side surface 222 of the anchoring module 220, and a distal end 234 opposite to the proximal end 232. The exemplary pBCB 210 further includes a first piezoelectric layer 240a laminated on the first main surface 236 of the shim 230 and a second piezoelectric layer 240b laminated on the second main surface 238 of the shim 230 with the piezoelectric layers 240a, 240b extending along substantially the entire length of the shim 230 from the proximal end 232 to the distal end 234.

In the system shown in FIG. 6, beam stiffeners 260a, 260b are formed on the exterior surfaces 242a, 242b of the piezoelectric layers 240a, 240b in substantially the same manner as the beam stiffeners 160a, 160b described above with respect to FIG. 5. That is to say, the exterior surfaces 262a, 262b of the beam stiffeners 260a, 260b are curved, and the beam stiffeners 260a, 260b start from the junction between anchoring module 220 and pBCB 210 as opposed to being integrated into the anchoring module 220.

Turning now to FIG. 7, in another exemplary embodiment, each of the beam stiffeners is comprised of multiple stacked layers. Similar to the system shown in FIG. 6, in the system of FIG. 7, the exemplary pBCB 310 includes a shim 330 having a first main surface 336, a second main surface 338 opposite the first main surface 336, a proximal end 332 positioned immediately adjacent to the side surface 322 of the anchoring module 320, and a distal end 334 opposite to the proximal end 332. The exemplary pBCB 310 further includes a first piezoelectric layer 340a laminated on the first main surface 336 of the shim 330 and a second piezoelectric layer 340b laminated on the second main surface 338 of the shim 330 with the piezoelectric layers 340a, 340b extending along substantially the entire length of the shim 330 from the proximal end 332 to the distal end 334.

As mentioned above, each of the beam stiffeners is comprised of multiple layers 371a-378a, 371b-371b stacked on the exterior surfaces 342a, 342b of the respective piezoelectric layer 340a, 340b with each of the layers 371a-378a, 371b-371b decreasing in length extending way from the shim 330. If the length of each layer 371a-378a, 371b-371b is properly designed, the whole multilayer structure so obtained can approximate a beam stiffener having the variable thickness. The thickness and the number of the layers will govern the accuracy of this approximation. As such, the overall effect of the stacked layers 371-378 provides a beam stiffener with decreasing thickness, similar to the beam stiffeners 60, 160, 260 described above. In fact, regardless of the particular configuration of the beam stiffeners, as illustrated in FIGS. 4-7, it is contemplated that in some preferred embodiments of the present invention, the thickness of the beam stiffeners is thickest immediately adjacent to the anchoring member with subsequent decreases in the thickness extending toward the distal end of the shim.

In embodiments where a multilayer structure is used, it is contemplated that the material of each of the layers can varying in composition to affect the overall stiffness of the individual layer and thus the response of the overall beam stiffener.

Figure 8:
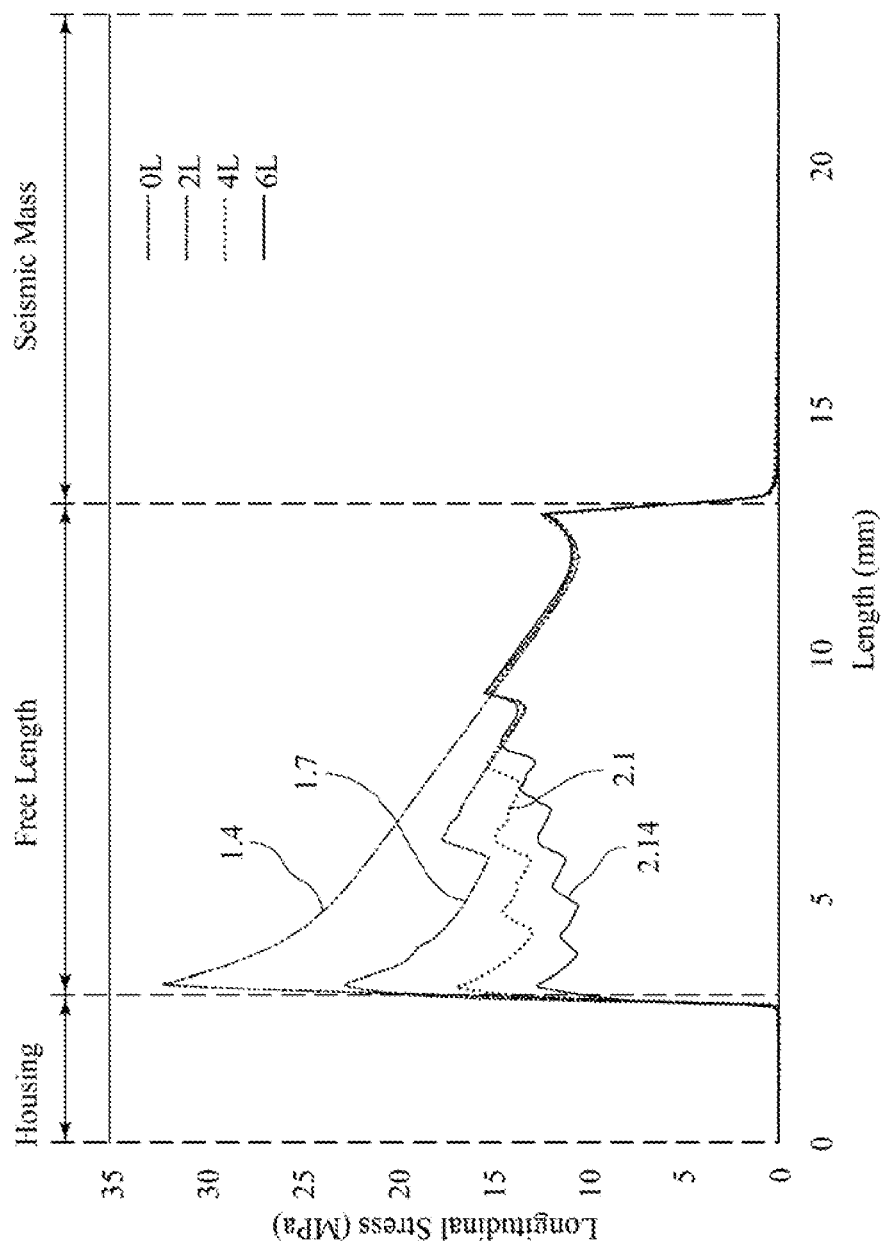
FIG. 8 is a graph illustrating variation of stress along a cantilever beams as affected by beam stiffeners.

The graph in FIG. 8 shows, as an example, the simulated profiles of the longitudinal component of the stress on one of the external surfaces in a free length (FL) of the piezoelectric layer. In this graph, four examples are compared in which beam stiffeners are formed of N number of brass layers, where each brass layer has a length successively decreased by FL/(N+1) with each of the brass layers having a thickness of 4 µm. In profile 0L is a cantilevered beam without beam stiffeners substantially similar to the structure shown in FIG. 2. By comparison, the profile 2L corresponds to a cantilevered beam including a stiffener composed of 2 layers, the profile 4L corresponds to a cantilevered beam including a stiffener composed of 4 layers, and the profile 6L corresponds to a cantilevered beam including a stiffener composed of 6 layers. The impact of the number of layers on the pBCB is represented by a figure of merit (FoM) defined as the ratio of the output power and the maximal stress. The FoM values for each profile illustrate the beneficial effect of an increased number of additional layers which greatly reduce the maximum stress level while the maximal output power is lowered only in smaller proportions. In particular, for the profile 0L the FoM is 1.4, for the profile 2L the FoM is 1.7, for the profile 4L, the FoM is 2.1, and for the 6L profile the FoM is 2.14

Figure 9:
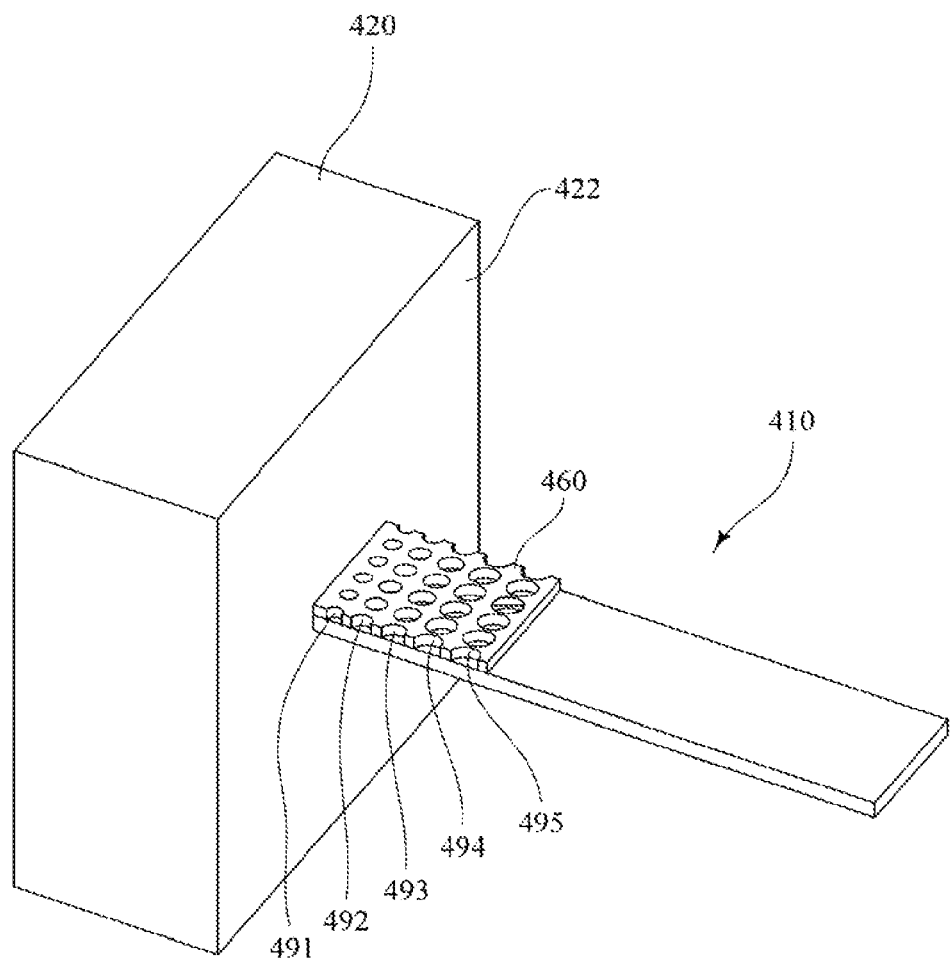
FIG. 9 is a perspective view of a fifth embodiment of a piezoelectric bimorph cantilever beam system made in accordance with the present invention.

Referring now to FIG. 9, in yet another exemplary embodiment of the present invention, a pBCB 410 attached in one of its end by an anchoring module 420. Although not expressly shown, it is contemplated that the pBCB 410 can be attached to the anchoring module 420 in either the manner shown and described above with respect to FIGS. 4-5 (i.e., with the pBCB 410 embedded in the anchoring module 420) or in the manner shown and described above with respect to FIGS. 6-7 (i.e., with the pBCB 410 attached directly to the side surface 422 of the anchoring module 420). The pBCB 410 further includes a stiffener 460 attached on one side of the pBCB 410 although it is contemplated that a second stiffener can also be attached to the other side of the pBCB 410. The stiffener 460 has circular holes 491-495 so that the remaining material of the stiffener 460 exhibit a longitudinal change of its tensile strength along the length of the pBCB 410, i.e., the X direction in FIG. 3. That is to say, a first line of holes 491 immediately adjacent to the anchoring module 420 are defined with a first diameter while a second line of holes 492 are defined with a second diameter larger than the first diameter. Likewise, a third line of holes 493, a fourth line of holes 494, and a fifth line of holes 495 each have progressively increasing diameters.

For smaller holes, such as the first line of holes 491, the aspect ratio between the hole size and the stiffener 460 thickness is typically 10:1 (e.g. a one hundred (100) micrometer hole diameter for a stiffener thickness of ten (10) micrometers). On the other hand for larger holes, such as the fifth line of holes 495, the aspect ratio of the wall separating two adjacent holes with regard to the stiffener thickness is also typically 10:1

With respect to placement, the centers of the holes from one line can be aligned with the adjacent line of holes with respect with the X direction of the beam or interleaved so that the center of a hole is located on the perpendicular bisector of the segment formed by the closest holes from an adjacent line. Whatever the hole arrangement between adjacent lines, the holes from the same line are preferably symmetric with respect to the medium plane of the pBCB 410 formed by the X and Z axes as defined in FIG. 3.

Figure 10:
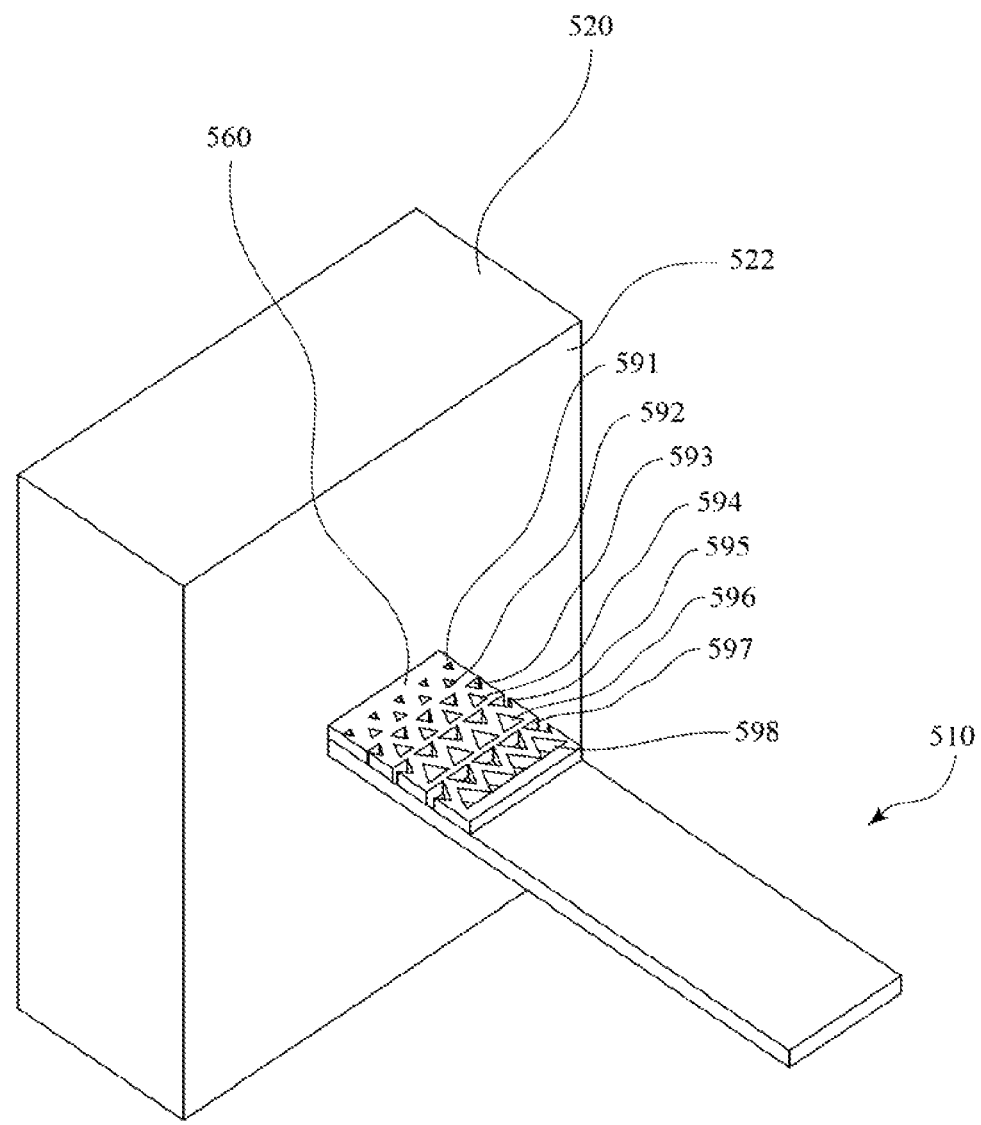
FIG. 10 is a perspective view of a sixth embodiment of a piezoelectric bimorph cantilever beam system made in accordance with the present invention.

Referring now to FIG. 10, alternatively shaped holes are also contemplated. In particular, as shown in FIG. 10, a pBCB 510 attached in one of its end by an anchoring module 520. Although not expressly shown, it is contemplated that the pBCB 510 can be attached to the anchoring module 520 in either the manner shown and described above with respect to FIGS. 4-5 (i.e., with the pBCB 510 embedded in the anchoring module 520) or in the manner shown and described above with respect to FIGS. 6-7 (i.e., with the pBCB 510 attached directly to the side surface 522 of the anchoring module 520). The pBCB 510 further includes a stiffener 560 attached on one side of the pBCB 510 although it is contemplated that a second stiffener can also be attached to the other side of the pBCB 510. The stiffener 560 has triangular holes 591-598 so that the remaining material of the stiffener 560 exhibit a longitudinal change of its tensile strength along the length of the pBCB 510, i.e., the X direction in FIG. 3. In particular, as shown in FIG. 10, alternating rows of holes are oppositely facing. That is to say, a first line of triangular holes 591, a third line of triangular holes 593, a fifth line of triangular holes 595, and a seventh line of triangular holes 597 are each facing the same direction whereas a second line of triangular holes 592, a fourth line of triangular holes 594, a sixth line of triangular holes 596, and an eighth line of triangular holes 598 are facing in the opposite direction. Furthermore each of the lines of holes 591-598 have progressively increasing sizes. Of course, the particular number, placement, and shape of holes is not limited.

Figure 11:
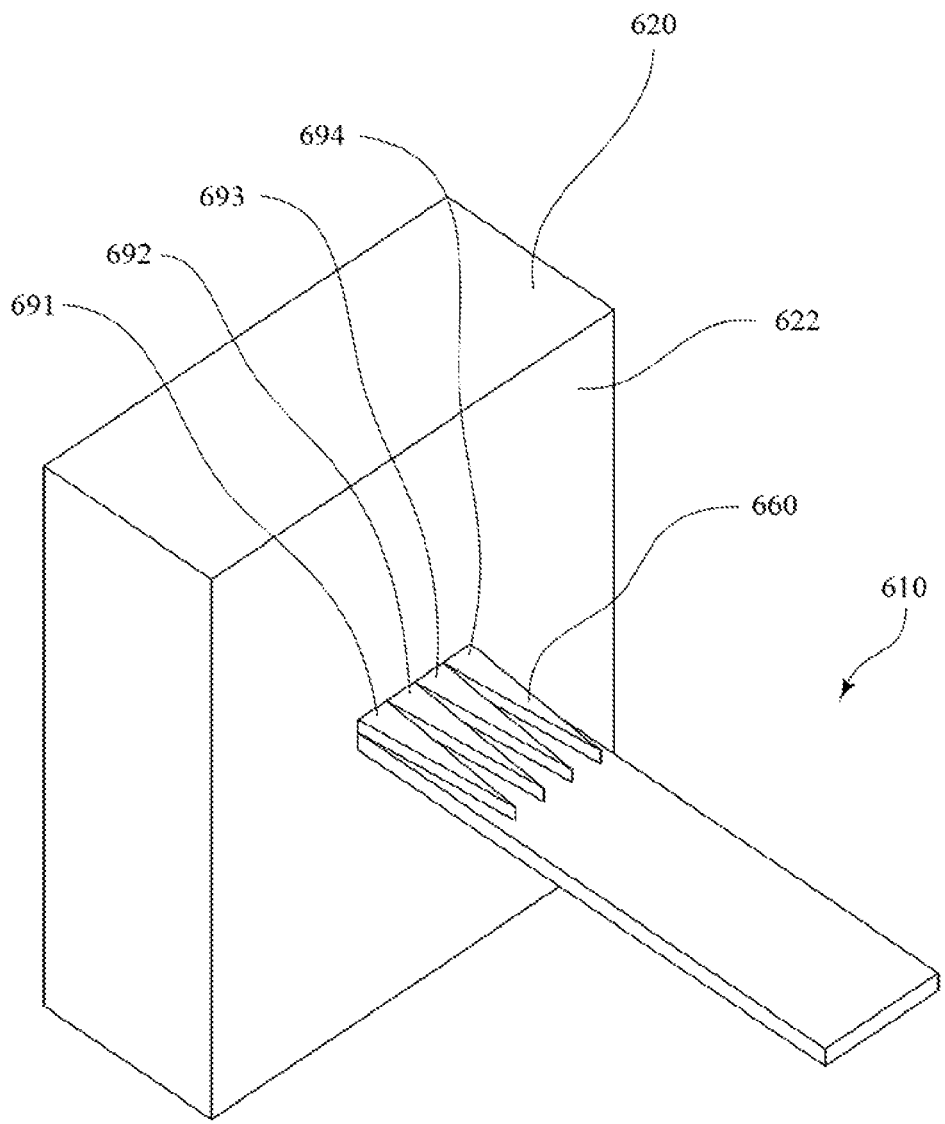
FIG. 11 is a perspective view of a seventh embodiment of a piezoelectric bimorph cantilever beam system made in accordance with the present invention.

Referring now to FIG. 11, rather than including multiple lines of holes in a stiffener, the stiffener can comprise multiple bodies that taper in width along the length of the stiffener such that the resulting gaps between the bodies widen over the length of the stiffener. In particular, as shown in FIG. 11, a pBCB 610 attached in one of its end by an anchoring module 620. Although not expressly shown, it is contemplated that the pBCB 610 can be attached to the anchoring module 620 in either the manner shown and described above with respect to FIGS. 4-5 (i.e., with the pBCB 610 embedded in the anchoring module 620) or in the manner shown and described above with respect to FIGS. 6-7 (i.e., with the pBCB 610 attached directly to the side surface 622 of the anchoring module 620). The pBCB 610 further includes a stiffener 660 attached on one side of the pBCB 610 although it is contemplated that a second stiffener can also be attached to the other side of the pBCB 610. The stiffener 660 is comprised of four bodies 691-694 which taper in width along the length of the stiffener 660 (i.e., from the anchoring module 620 towards the distal end of the pBCB 610) such that the holes formed between the bodies widen over the length of the stiffener 660. In the embodiment shown in FIG. 11, the bodies 691-694 of the stiffener collectively extend across the entire width of the pBCB 610 adjacent to the anchoring module 620 and each of the bodies 691-694 are substantially triangular tapering as the bodies 691-694 extend away from the anchoring module 620. Of course, the particular number, placement, and shape of the bodies is not limited.

In embodiments where the surface area of the beam stiffener is non-uniform, such as in the exemplary embodiments shown in FIGS. 9-11, it is contemplated that the holes can be filled with materials different than the material of the remaining stiffener to affect the overall stiffness of the beam stiffener. Furthermore, it should be understood that the non-uniform layers can be formed into stacks providing for even further customization of the response of the overall beam stiffener.

The piezoelectric bimorph cantilever beam of the present invention can be obtained with several manufacturing processes. As an example but not limited to, the stiffener can be added to the bimorph structure with different methods of deposition like screen-printing, ink-jet printing, dip coating, spin coating, spraying, sputtering, aerosol deposition method, electrophoresis, electroless method, or electrochemical method. According to these methods, the stiffener is formed through subsequent deposition steps using masks to hide a zone of the prior layer that needs to be thinner.

According to another method, the stiffener is formed by over molding with a resin (e.g., epoxy, polyurethane, silicon, etc.). Advantageously, an over molding process can result in a smooth shape for the stiffener.

According yet another method, a stiffener is formed by first forming a uniform layer and subsequently removing material from the stiffeners through laser ablation process of selective etching to form an arrangement of hole or like.

One of ordinary skill in the art will recognize that additional embodiments are possible without departing from the teachings of the present invention. This detailed description, and particularly the specific details of the exemplary embodiment disclosed therein, is given primarily for clarity of understanding, and no unnecessary limitations are to be understood therefrom, for modifications will become obvious to those skilled in the art upon reading this disclosure and may be made without departing from the spirit or scope of the invention.

REFERENCES

[1]. Benasciutti, D., Moro, L., Zelenika S., Vibration energy scavenging via piezoelectric bimorphs of optimized shapes, Microsyst Technol, 2010, pp. 657-668.

[2]. Defosseux, M., Allain, M., Basrour, S., Comparison of different beam shapes for piezoelectric vibration energy harvesting, Proceedings of PowerMEMS 2010, November 30-December 3, Leuven, Belgium, pp. 339-342.

[2]. Seddik, B. A., Defay, E., Despesse, G., Optimized device for converting mechanical energy into electrical energy, US Pat. No. 2013/0342075.

What is claimed is:

1. A piezoelectric bimorph cantilever beam system for harvesting electrical energy from vibrations, the system comprising:

a shim including a first main surface, a second main surface opposite the first main surface, a proximal end connected to an anchor, and a distal end opposite the proximal end;

a first piezoelectric layer made of a piezoelectric material and laminated on the first main surface of the shim;

a second piezoelectric layer made of the piezoelectric material and laminated on the second main surface of the shim; and a first beam stiffener made of a material other than the piezoelectric material and provided over the first main surface of the shim adjacent to the anchor, the first beam stiffener at least partially covering the first piezoelectric layer, wherein the first beam stiffener has a variable thickness decreasing from the anchor towards the distal end of the shim.

2. The system according to claim 1, further comprising:

a second beam stiffener made of the material other than the piezoelectric material and provided over the second main surface of the shim adjacent to the anchor, the second beam stiffener at least partially covering the second piezoelectric layer, wherein the second beam stiffener has a variable thickness decreasing from the anchor towards the distal end of the shim.

3. The system according to claim 1, wherein the first beam stiffener, the second beam stiffener, or both the first beam stiffener and the second beam stiffener have a substantially flat exterior surface.

4. The system according to claim 1, wherein the first beam stiffener, the second beam stiffener, or both the first beam stiffener and the second beam stiffener have a curved exterior surface.

5. The system according to claim 2, wherein the first beam stiffener, the second beam stiffener, or both the first beam stiffener and the second beam stiffener comprise multiple layers stacked on the piezoelectric layer with each of the multiple layers decreasing in length extending away from the shim.

6. The system according to claim 5, wherein one or more of the multiple layers is comprised of a material having a composition different than a material of another of the multiple layers.

7. The system according to claim 2, wherein the first beam stiffener, the second beam stiffener, or both the first beam stiffener and the second beam stiffener define a plurality of holes varying in size based on its location along the shim.

8. The system according to claim 7, wherein the plurality of holes increase in size from the anchor towards the distal end of the shim.

9. The system according to claim 7, wherein the plurality of holes are filled with a material different than the material of the remaining beam stiffener.

10. The system according to claim 6, wherein the plurality of holes are symmetrical about a center line running a length of the shim.

11. The system according to claim 5, wherein one or more of the multiple layers define a plurality of holes varying in size based on its location along the shim.

12. The system according to claim 2, wherein the first beam stiffener is incorporated into the anchor;

the second beam stiffener is incorporated into the anchor; and the first beam stiffener and the second beam stiffener are formed simultaneously with the anchor.

13. The system according to claim 12, wherein the first beam stiffener, the second beam stiffener, or both the first beam stiffener and the second beam stiffener have a substantially flat exterior surface.

14. The system according to claim 12, wherein the first beam stiffener, the second beam stiffener, or both the first beam stiffener and the second beam stiffener have a curved exterior surface.

* * * * *